United States Patent [19]

Hsu

[11] Patent Number: 5,581,255
[45] Date of Patent: Dec. 3, 1996

[54] EMBEDDED SUBRANGING ANALOG TO DIGITAL CONVERTER

[75] Inventor: Po-Chin Hsu, Taipei, Taiwan

[73] Assignee: Industrial Technology Research Institute, Hsinchu, Taiwan

[21] Appl. No.: 497,881

[22] Filed: Jul. 3, 1995

[51] Int. Cl.$^6$ ...................................................... H03M 1/16
[52] U.S. Cl. ................................................................ 341/156
[58] Field of Search .................................... 341/156, 118, 341/155, 94, 159, 161, 162

[56] References Cited

U.S. PATENT DOCUMENTS

| | | | |
|---|---|---|---|
| 4,618,850 | 10/1986 | Lenhoff | 341/118 |
| 4,733,217 | 3/1988 | Dingwall | 340/347 |
| 4,862,171 | 8/1989 | Evans | 341/156 |
| 4,903,028 | 2/1990 | Fukushima | 341/156 |
| 5,223,836 | 6/1993 | Komatsu | 341/156 |
| 5,291,198 | 3/1994 | Dingwall et al. | 341/159 |
| 5,302,869 | 4/1994 | Hosotani et al. | 307/518 |
| 5,349,354 | 9/1994 | Ito et al. | 341/156 |
| 5,353,027 | 10/1994 | Vorenkamp et al. | 341/156 |
| 5,369,309 | 11/1994 | Bacrania et al. | 327/94 |
| 5,387,914 | 2/1995 | Mangelsdorf | 341/156 |
| 5,389,929 | 2/1995 | Nayebi et al. | 341/156 |
| 5,400,029 | 3/1995 | Kobayashi | 341/156 |

*Primary Examiner*—Brian K. Young
*Attorney, Agent, or Firm*—George O. Saile

[57] ABSTRACT

An analog to digital converter for the conversion of an analog input voltage to a digital output voltage signal of n bits has a plurality of voltage sources (Voltage Reference Generator) that divide the total range of voltage of the conversion input into increments of voltage equal to the smallest increment of resolution. The n bits of digital output are divided into an upper segment or Most Significant Bits (MSB) and a lower segment or Least Significant Bits (LSB). The Most Significant bits are encoded from a set of digital signals from a plurality of comparators (Coarse Subrange Comparators) that compare the voltage input with a subset of Voltage Reference Generator representing the coarse range. The Coarse Subrange Comparator outputs are used to determine the placement of a plurality of Embedded Subrange Comparators that are used to detect any error in the codes of the Coarse Subrange Comparators. The output of the Coarse and Embedded Subrange Comparators are now used to determine the connection of a plurality of Fine Subrange Comparators to the Voltage Reference Generator in the section of the Coarse Subrange to accurately determine the smallest increment of resolution for the Analog to Digital Converter. The codes from the Coarse, Embedded, and Fine Subrange Comparators become the input to an encoder to determine the output digital voltage that represent the input voltage.

34 Claims, 10 Drawing Sheets

EMBEDDED SUBRANGING ANALOG TO DIGITAL CONVERTER

BACKGROUND OF INVENTION

1. Field of the Invention

The present invention relates generally to Analog to Digital (A/D) converters and converting methods, and more particularly to two stage parallel type converters which use the first stage of conversion to determine the coarse range of the input voltage and a second stage to resolve the fine increment of the input voltage. The present invention has applicability to video and digital signal processing.

2. Description of the Background Art

The application of digital processing and transmission methods to analog information requires a technique for the conversion of signals from their analog form to a digital representation. Well known types of A/D converters include the Successive Approximation type which produces a digital output using a digital to analog converter to create successive trial and error approximations of the input, and the parallel comparator type or FLASH converter, which compares multiple voltage references to the input voltage and outputs from the encoding logic the digital code representing the voltage reference closest to the input voltage in one operation. FIG. 1 shows a representation of the FLASH type of A/D Converter. Typically the output is a binary code that is constructed in the Encoder Logic 30 thus providing an n bit resolution of the input signal. This structure typically requires $2^n$ voltage references 10 and $2^n$ comparators 20. As the resolution of this type of converter is improved (the number of output bits increases), the design becomes unwieldy.

In order to simplify the design of the FLASH A/D Converter, two techniques are known. In beth techniques multiple stages of conversion are used accomplish the A/D conversion. In the first technique, as shown in U.S. Pat. No. 5,302,869 (issued Apr. 12, 1994 to Hosotani et al. for a "Voltage Comparator and Subranging A/D Converter Including Such Voltage Comparator"), U.S. Pat. No. 5,389,929 (issued Feb. 14, 1995 to Nayebi et al. for a "Two-Step Subranging Analog-To-Digital Converter"), U.S. Pat. No. 5,353,027 (issued Oct. 4, 1994 to Vorenkamp et al. for a "Multistep Analog-To-Digital Converter With Error Correction"), U.S. Pat. No. 5,369,309 (issued Nov. 29, 1994 to Bacrania et al. for an "Analog-To-Digital Converter and Method of Fabrication"), and U.S. Pat. No. 5,387,914 (issued Feb. 7, 1995 to Mangelsdorf for a "Correction Range Technique for Multi-Range A/D Converter"), the first stage is a coarse resolution FLASH A/D conversion and the second stage, with a Digital to Analog Converter, adjusts the voltage references of the voltage comparators to form a fine resolution conversion. The results of the two conversions are encoded to form the digital output word representing the magnitude of the analog input voltage. In the second technique, as shown in U.S. Pat. No. 5,291,198 (issued Mar. 1, 1994 to Dingwall et al. for an "Averaging Flash Analog-To-Digital Converter"), U.S. Pat. No. 5,223,836 (issued Jun. 29, 1993 to Komatsu for a "Subranging Analog-To-Digital Converter With Priority Weighted Correction for the M.S.B. Group"), U.S. Pat. No. 5,400,029 (issued to Kobayashi for an "Analog-Digital Converter Circuit Device and Analog-Digital Conversion Method"), U.S. Pat. No. 4,733,217 (issued Mar. 22, 1988 to Dingwall for a "Subranging Analog-To-Digital Converter"), U.S. Pat. No. 5,349,354 (issued Sep. 20, 1994 to Ho et al. for an "A/D Converter And Converting Method Having Coarse Comparison And Fine Comparison Periods"), there will be multiple conversion stages with voltage references being appropriately switch to each stage by decision logic based on the results of the previous comparison stages.

As an example of the second techniques of multiple stage conversion, see in FIG. 2., which is a schematic diagram of U.S. Pat. No. 4,903,028 (issued Feb. 20, 1990 to N. Fukashima for an "Analog to Digital Converter"), that by creating a set of voltage sources 1 that have incrementally increasing values from $V_{REFBOT}$ (the lowest value) to $V_{REFTOP}$ (the highest value) establishes the range of conversion of the voltage input ($V_{in}$). A set of Coarse Subranging Comparators 2 are connected to the voltage input and to the set of voltage reference at discrete intervals establishing the course subranges 1a,1b of $V_{in}$. The output of the Coarse Subrange Comparators 5 is the input to a Steering Logic and Switch Unit 3 that places a set of Fine Subrange Comparators 4 at the appropriate Subrange of the Voltage Reference Set 1. The set of Voltage References 1a are divided into fine increments establishing the maximum resolution of the conversion of $V_{in}$ to Digital Output {D0, D1, D2, ..., Dn}. As $V_{in}$ changes the value of the output codes or the Coarse Subrange Comparators 5 change and the Steering Logic and Switch Unit 3 moves the Fine Subrange Comparators 4 to the next subrange (from 1a to 1b).

Due to the tolerances in component selection and process variation, the Output Codes 5 of the Coarse Subrange Comparators 2 may be in error. To detect this error, there will be Extra Fine Subrange Comparators 4a&4b that will be placed above and below the subrange 1a or 1b determined by $V_{in}$. The output of the Extra Fine Comparators 4a&4b form an error code 7. The output codes for Fine Subrange Comparators 6, the set of error codes 7, and the set of Coarse Subrange Codes 5 are interpreted by the Output Encoding Logic 8 to determine the output digital representation {D0, D1, D2, ..., Dn}. of the voltage input $V_{in}$.

SUMMARY OF THE INVENTION

In the foregoing there are two sets of error detection circuits. The error correction function is stimulated on only one side of the Coarse Subrange on each comparison cycle of the Fine Subrange comparators. This type of configuration consumes additional power and adds additional complexity to the physical implementation. To reduce the number of extra comparators and simplify the complexity of the physical structure, the present invention (FIG. 3) uses a set of Embedded Coarse Subrange Comparators 140. The reference codes generated by the Embedded Coarse Comparators determine the proper reference range for the Fine Subrange Comparators 160. The codes from the Coarse Subrange Comparators 170, the Embedded Coarse Subrange Comparators 180, and the Fine Subrange Comparators 190 are encoded to form the output digital code. The selection to the placement of the Embedded Coarse Subrange Comparators 140 input references 131 are determined by the Embedded Coarse Subrange Selection Logic and Switches 130 from the input codes of the Coarse Subrange Comparators 170. The placement of the Fine Subrange Comparators References 151 are determined by the Fine Subrange Selection Logic and Switches 150 with input from the Coarse Subrange Comparators 170 and the Embedded Coarse Comparators 180.

3

Figure 1:
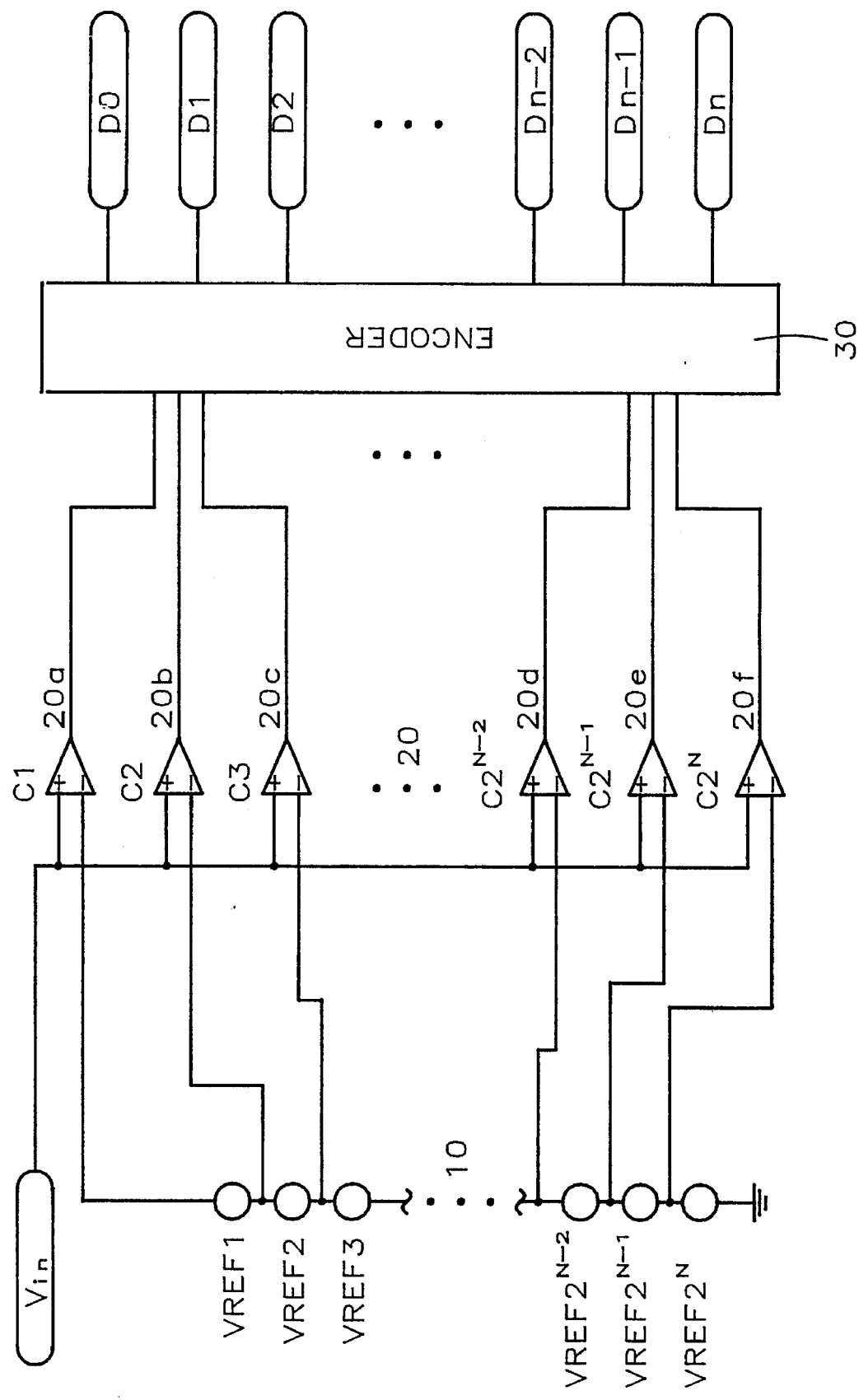
FIG. 1 is drawing illustrating the prior art of parallel or FLASH A/D Converters.
Figure 2:
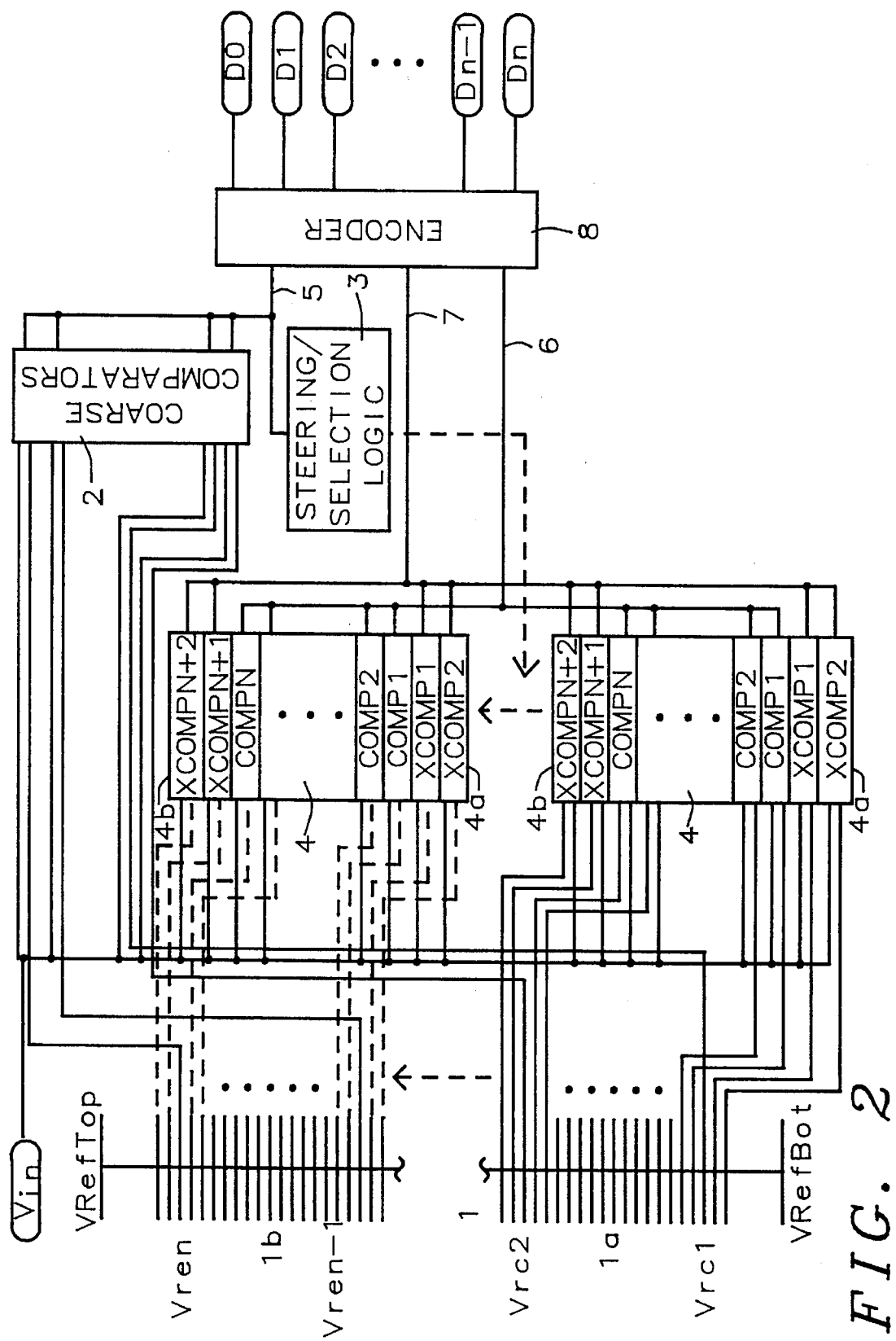

FIG. 2 is a schematic of the prior art found in U.S. Pat. No. 4,903,028 illustrating a two stage Flash A/D Converter.

Figure 3:
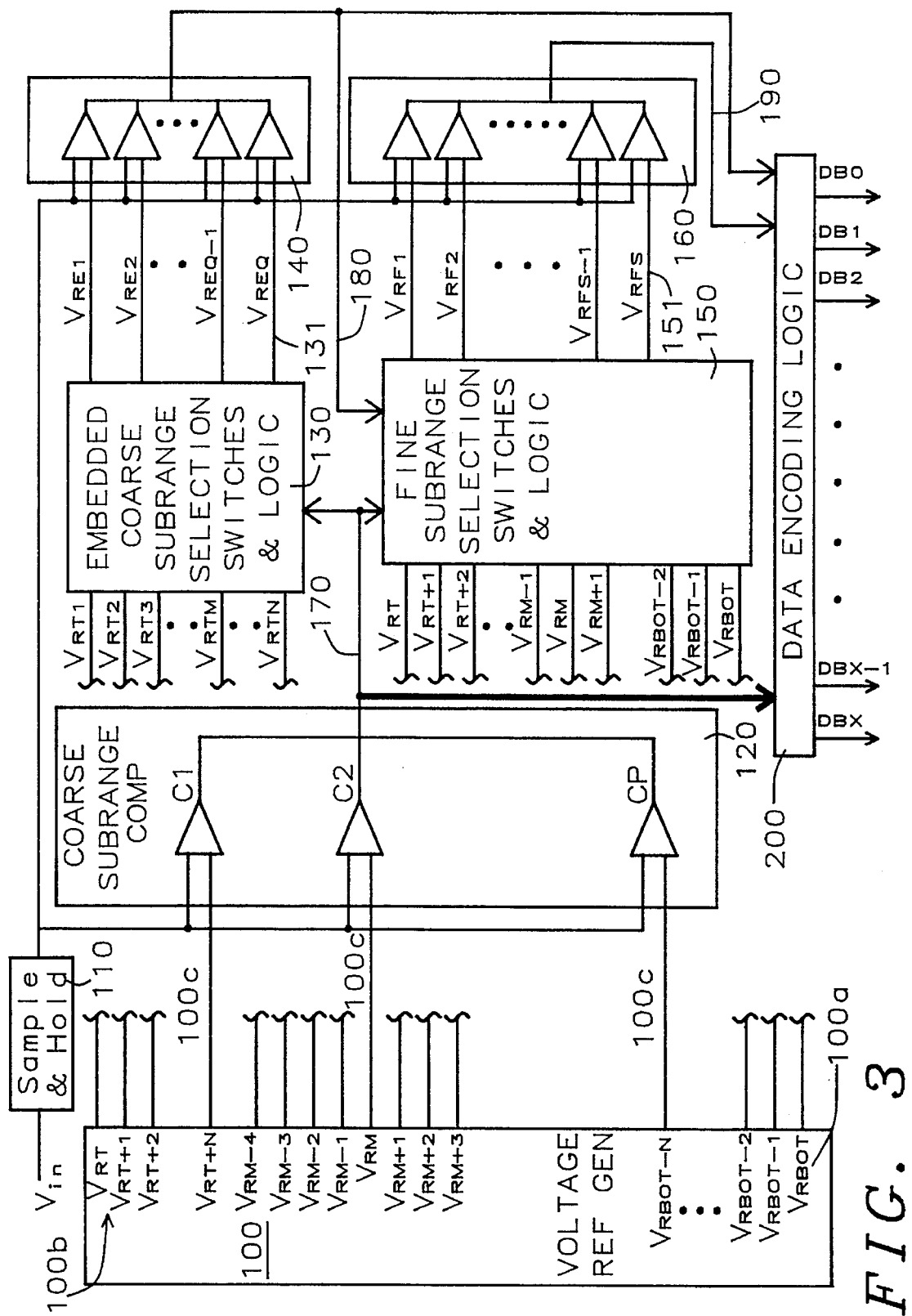

FIG. 3 is a schematic diagram of the structure of the A/D converter described in this invention.

Figure 4:
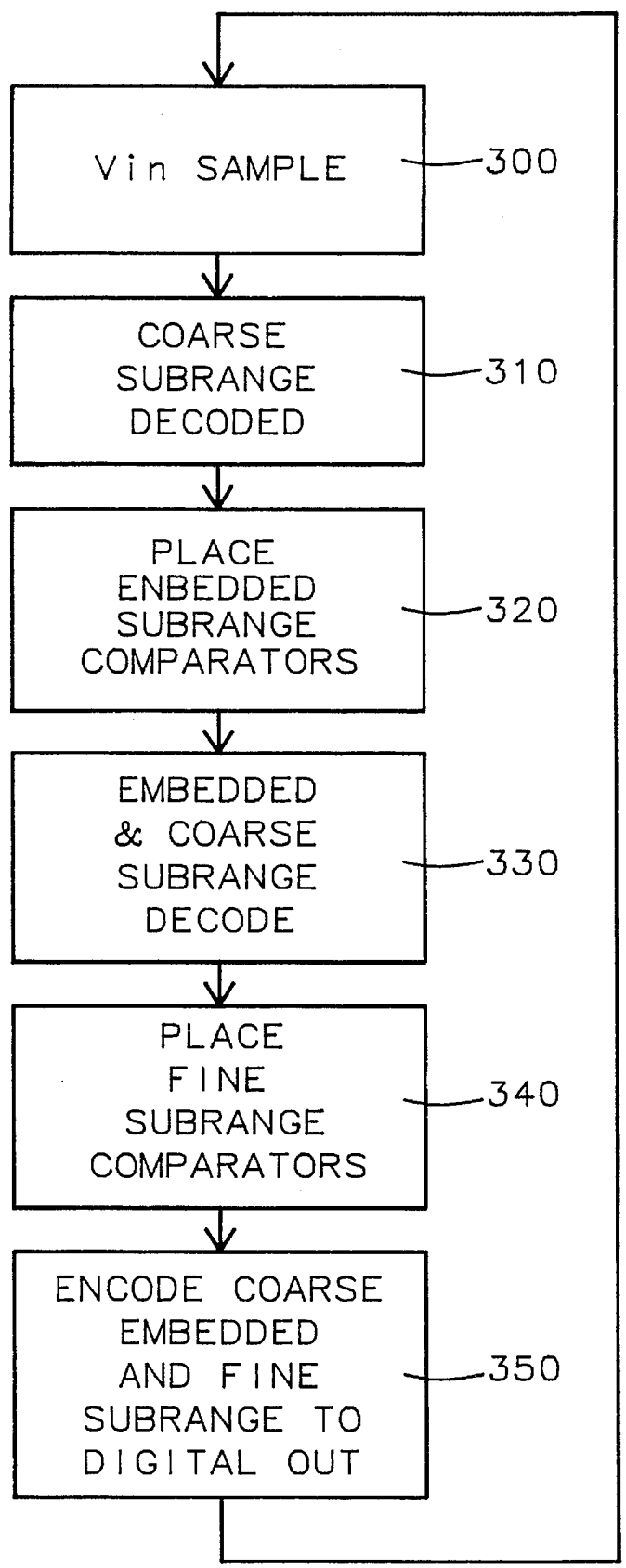

FIG. 4 is a diagram describing the decision process structure of this invention.

Figure 5:
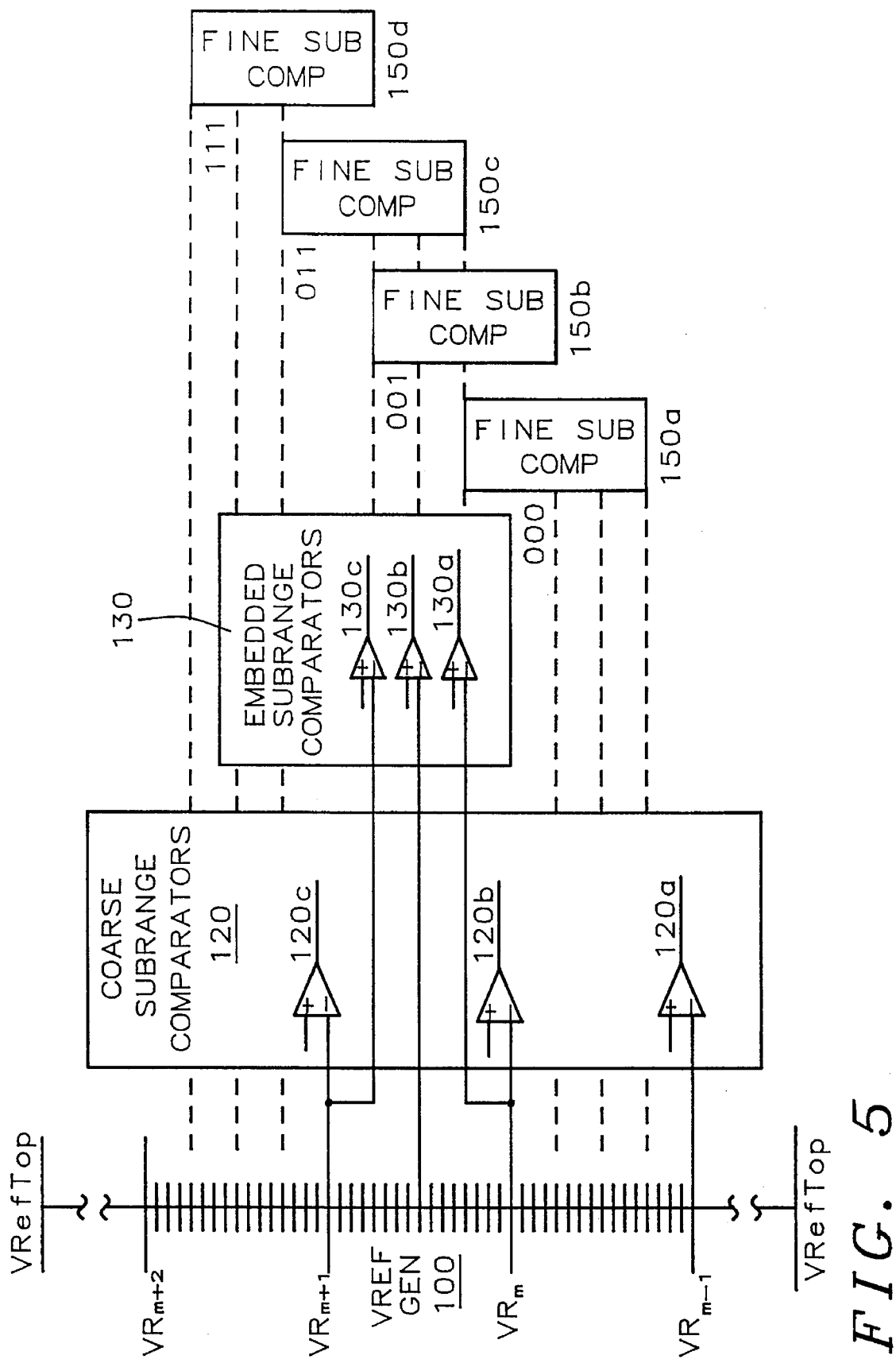

FIG. 5 is a diagram describing the algorithm for the placement of Fine Subrange Comparators in this invention.

Figure 6:
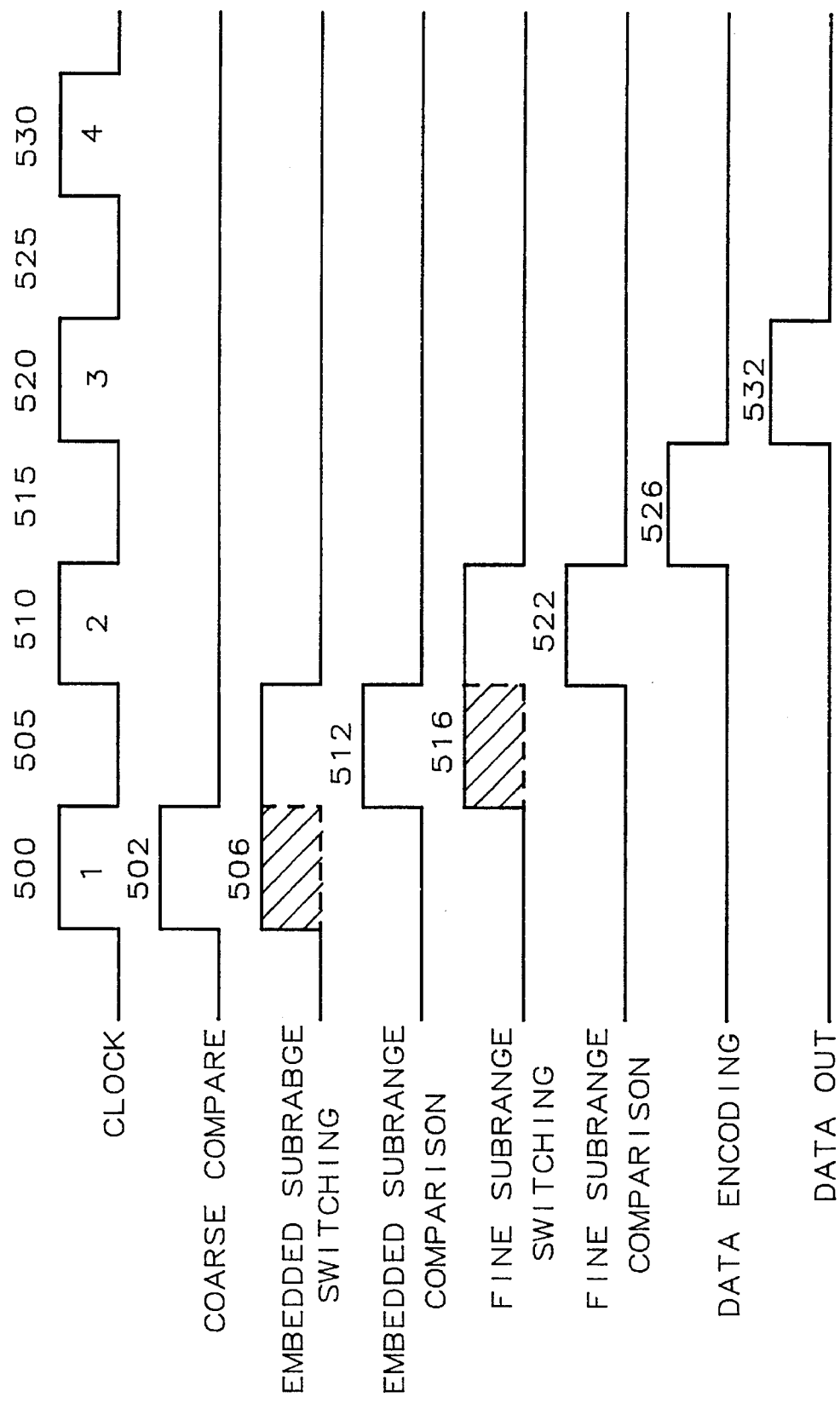

FIG. 6 is a timing diagram of a conversion cycle for the present invention.

Figure 7:
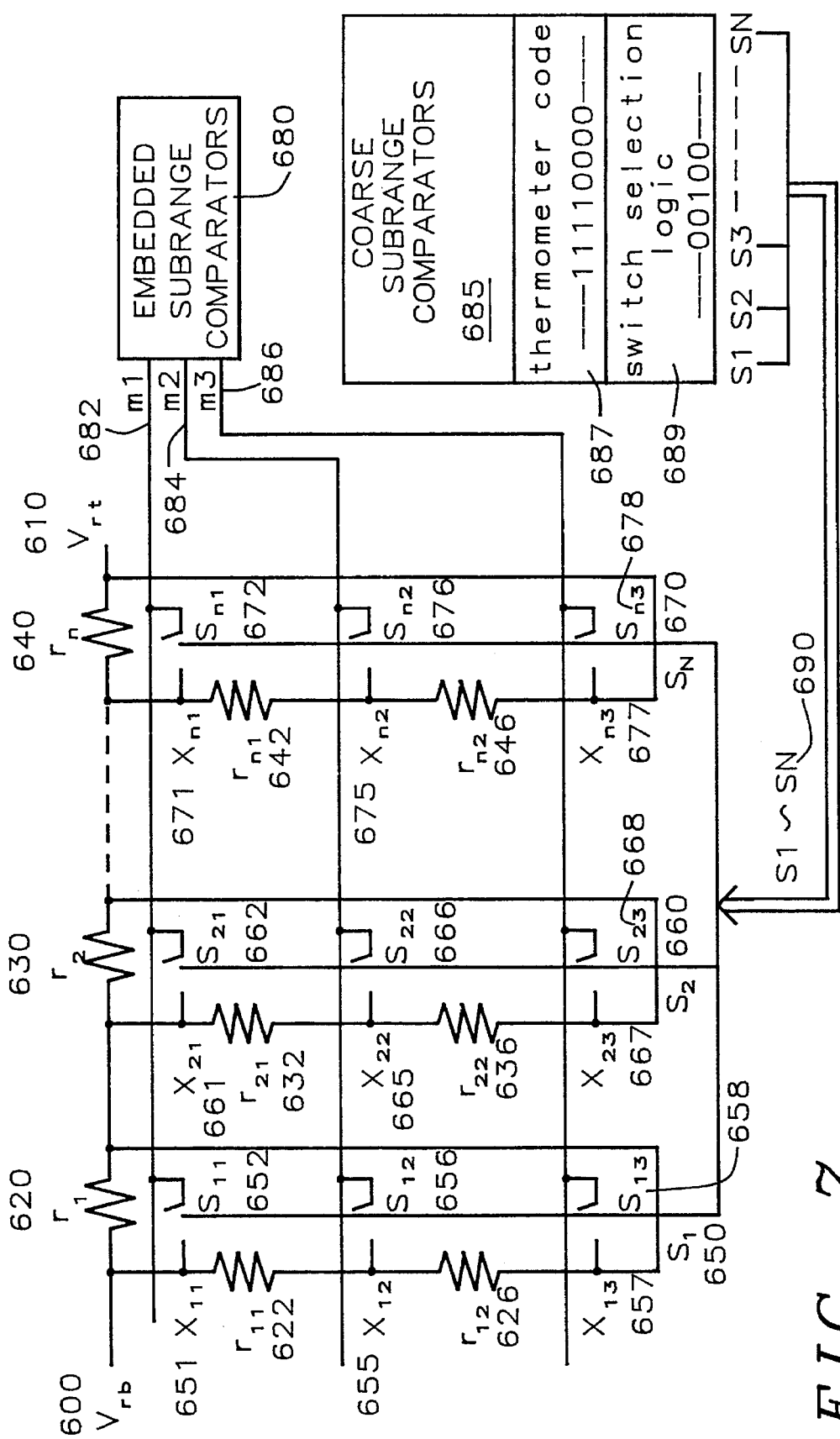

FIG. 7 is a schematic diagram of the preferred embodiment of the Embedded Subrange Selection Logic and Switches.

Figure 8A:
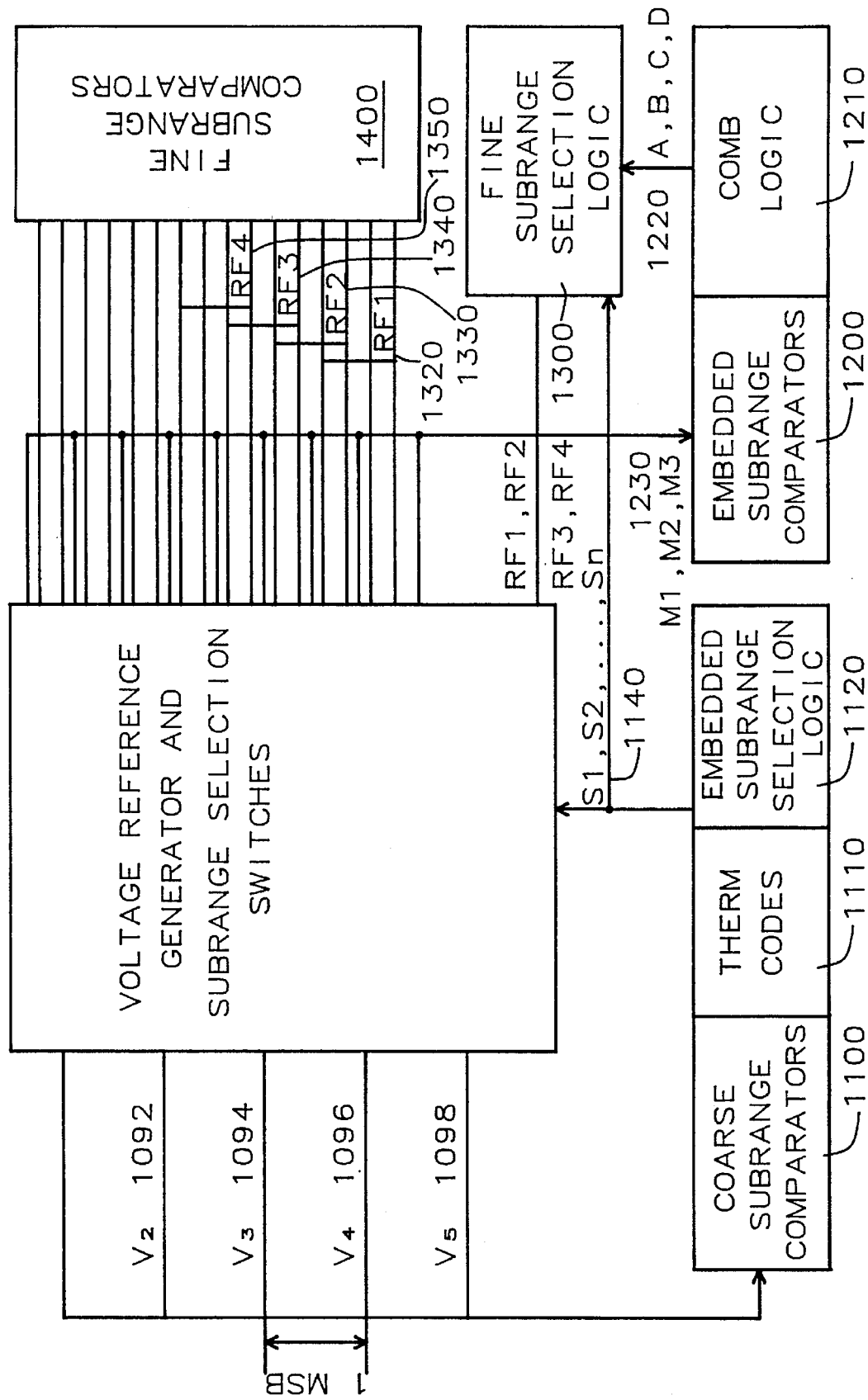
Figure 8B:
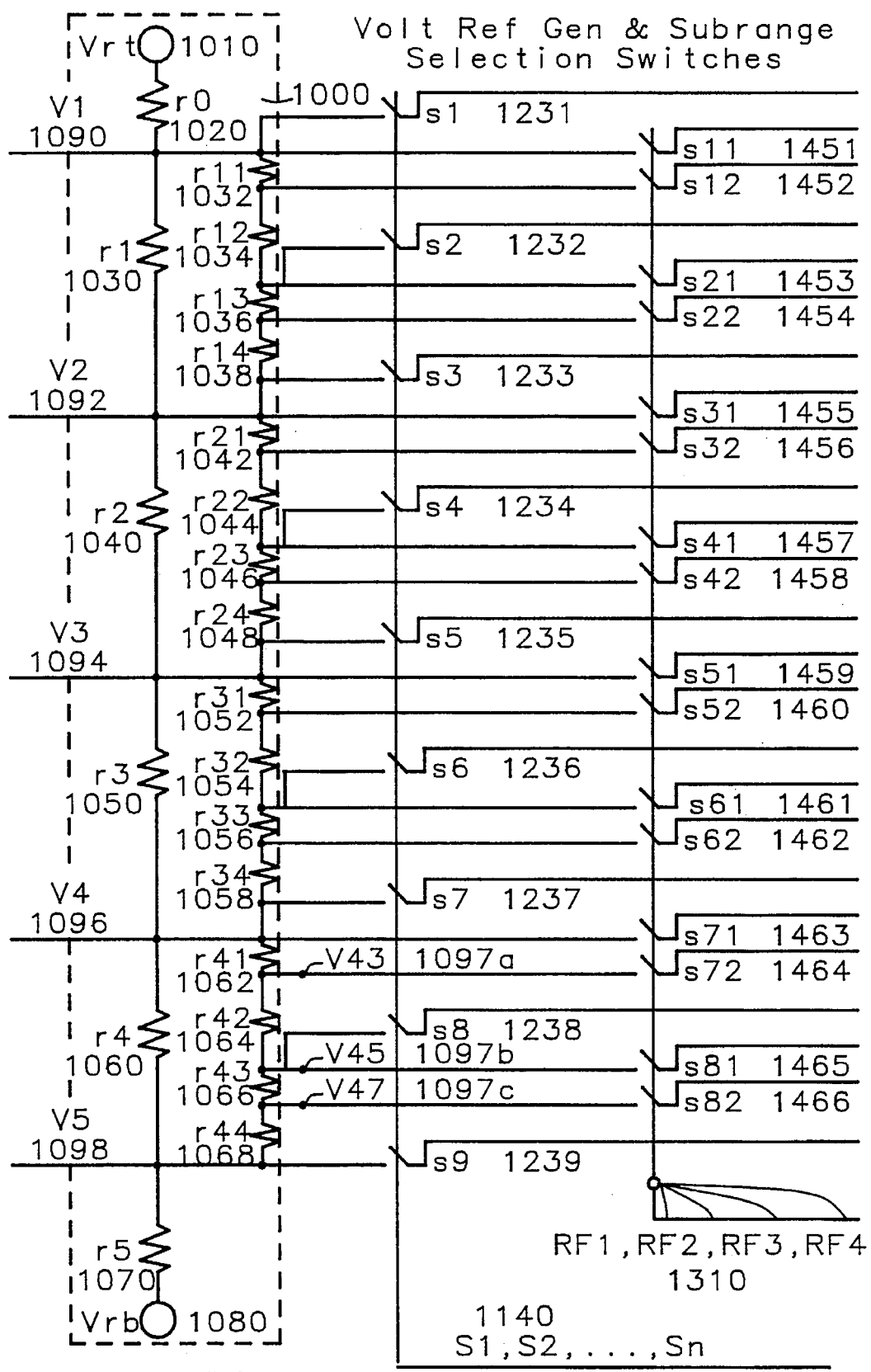

FIGS. 8a and 8b are schematic diagrams of the preferred embodiment of the Fine Subrange Selection Logic and Switches.

Figure 9:
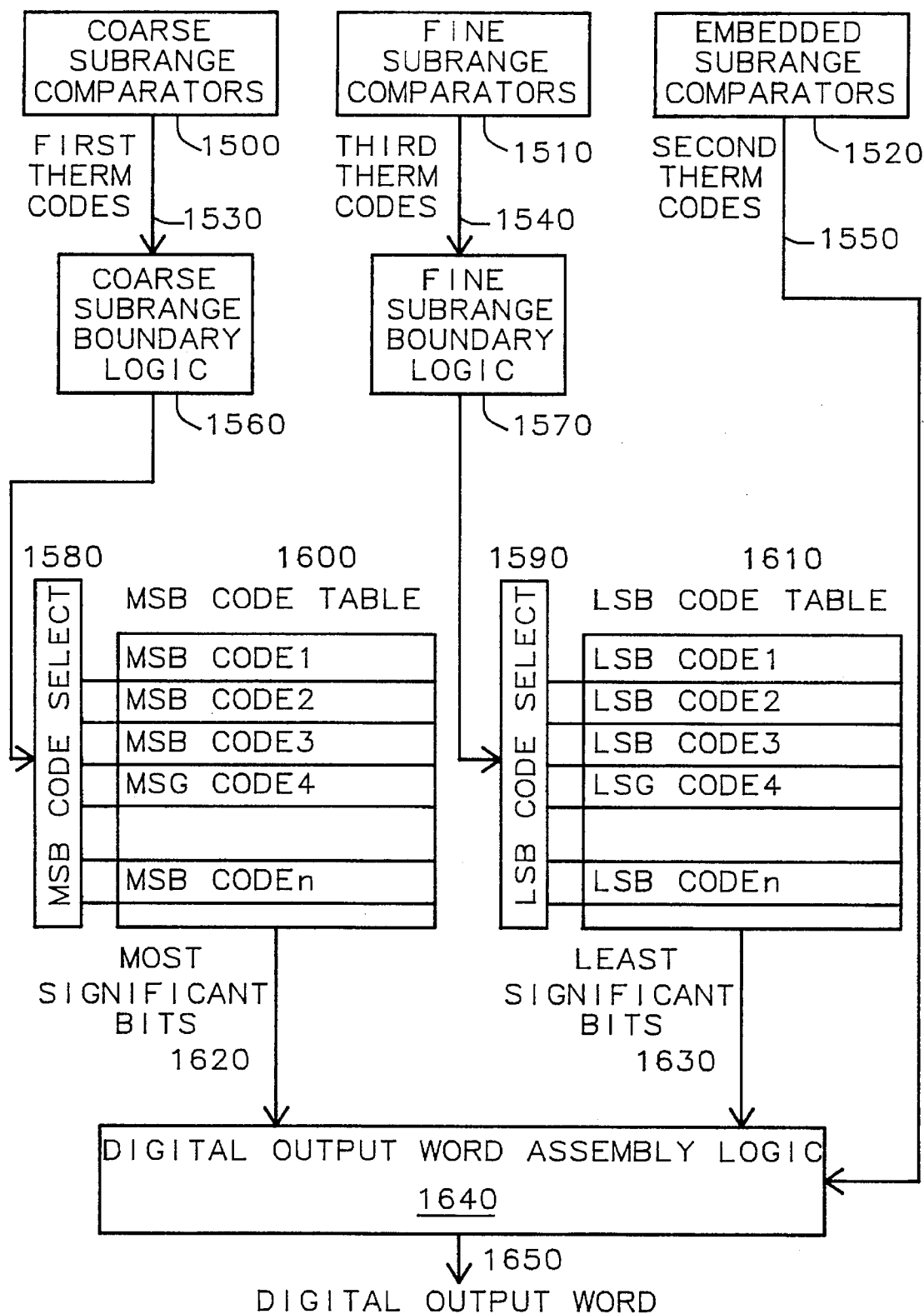

FIG. 9 is a schematic diagram of the preferred embodiment of the Digital Output Word Assembly Logic.

DETAILED DESCRIPTION OF THE INVENTION

Referring to FIG. 3, Voltage Reference Generator 100 is a structure that can create a set of reference voltages that incrementally increase from the value of $V_{REFBOT}$ 100a to $V_{REFTOP}$ 100b. The number of incremen3ts is dependent on the number of desired bits of output digital code {DB0, DB1, DB2, . . . , Dbn}. For instance, if the digital code were n and each bit represented a binary digit then the function for the number of voltage references would be $2^n$ (As an example if n were 8, the number of references would be $2^8$ or 256 voltage references).

The number of Coarse Subrange Comparators 200 is determined by the number of bits that is desired to segment the output word into sections called the Most Significant Bits (MSB) and the Least Significant Bits (LSB). The MSB's translates into the Coarse Representation of the Analog Input Voltage ($V_{in}$). If the digital code were n bits as above and the coarse subrange was to be ½ of the number of digits, then the number of Coarse Subrange Comparators 200 would be $2^{n/2}$ (as an example if n=8, the number of Coarse Subrange Comparators 200 would be $2^{8/2}$ or 16 comparators). The Coarse Subrange Comparators 200 would be connected permanently to the Voltage Reference Generator 100 at discrete increments {$V_{REFBOT-N}$, ... $V_{RM}$, ..., $V_{REFTOP+N}$}. This interval being dependent on the conversion function of the $V_{in}$ to the digital output {DB0, DB1, DB2, . . . , Dbn} (for example if n=8 and the range of interest of $V_{in}$ were from 0 volts to 1 volt then LSB of each binary number would be represent 1/256 volt. If the number of MSB's were determined to be 4 then the Coarse Subrange Comparators would be place at and interval of 16 binary counts or every 1/16 Volt). The Input Voltage ($V_{in}$) is sampled periodically by the Sample and Hold Circuit 110 and presented to as $V_{ain}$ to the Coarse Subrange Comparators 200 to be compared to the Voltage References 100c. The output of the Comparators will switch to the desired logic level if the $V_{in}$ is greater than or less than the voltage references 100c (for example the comparators may output a voltage level representing a logical 1 for an input greater than $V_{REF}$ and the voltage level representing a logical 0 for an input less than $V_{REF}$).

The digital outputs of the Coarse Subrange Comparators are connected as input to the Embedded Coarse Subrange Selection Logic and Switch Circuitry 130. Each coarse subrange of the Voltage Reference Generator 100 is divided by the number of the Embedded Coarse Subrange Comparators 140.

The number of Embedded Coarse Subrange Comparators 140 is arbitrary and is chosen to simplify the Embedded Coarse Subrange Selection Logic and Switch Circuitry 130 and to establish an appropriate error correction range. (For example if the number of the Embedded Coarse Subrange Comparators 140 is chosen to be three and the number of fine increments in a coarse subrange is 16 then first, eighth, and sixteenth voltage references to be connected to the Embedded Coarse Subrange Comparators to cover the range). Depending on the value of the codes of the Coarse Subrange Comparators 170 the appropriate subrange is selected and switched and the references are connected to the Embedded Coarse Subrange Comparators 140 to be compared with the Input Voltage $V_{ain}$. In an embodiment shown in FIG. 7, the outputs of the Coarse Subrange Comparators 170 form a first set of thermometer codes (a binary code that is formed by each successive digit of the code changing to a "1" as the code increases, for example:

| | |
|---|---|
| 0000 | the lowest value of the code |
| 0001 | |
| 0011 | |
| 0111 | |
| 1111 | the highest value of the code) | that determines the coarse value of the input voltage Vain from FIG. 3. The thermometer codes 172 are the inputs to the Selection Logic Array 132. The output of the Selection logic Array 132 sets the Steering Switches 134a, 134b, 134c to connect the correct Voltage Reference of the Voltage Reference Generator 100 to the Embedded Coarse Subrange Comparators 140. In FIG. 3, the output of the Embedded Coarse Subrange Comparators 180 form a second thermometer code which, when combined logically with the output of the Coarse Subrange Comparators 170 in the Fine Subrange Selection Logic and Switches 150 determines the placement of the finest increments of the Voltage Reference Generator 100 to the Fine Subrange Comparators 160. The output of the Fine Subrange Comparators 160 form a third set of thermometer codes that define the finest increment of the input voltage Vain.

The first thermometer code outputs of the Coarse Subrange Comparators 170, the second thermometer code outputs of the Embedded Coarse Subrange Comparators 180, and the third thermometer code of the Fine Subrange Comparators 190 form the input to Data Encoding Logic 200. The logic translate the inputs into digital output representation of the voltage input $V_{in}$.

Referring to FIG. 4. the process enabled by the circuitry is the sampling of the input voltage 300 and presenting it to the Coarse Comparators. The output of the Coarse Comparators are then decoded 310. This decoded information is used to set the switches that place the Embedded Coarse Subrange Comparators in their appropriate subrange of the voltage reference 320. The output of the Coarse Subrange Comparators and the Embedded Coarse Subrange Comparators are further decoded 330 and the switches set to connect the Fine Subrange Comparators to the appropriate region of the subrange of the voltage references 340. The outputs of the Coarse Subrange, the Embedded Coarse Subrange, and Fine Subrange Comparators are then encoded to form the digital output code of the circuitry 350. The next cycle of conversion will then be started.

Referring to FIG. 5 the range of the Voltage Reference Generator 100 is shown with two segments of the coarse subrange shown $\{V_{RM-1}\text{-}V_{RM}\text{-}V_{RM+1}\}$. If the output of comparators 120a and 120b have a digital value of 1 and comparator 120c has a digital value of 0 then the Embedded Coarse Subrange Comparators 130 will be placed in the range between $V_{RM}$ and $V_{Rm+1}$. The output thermometer codes of the Embedded Coarse Subrange Comparators 130 determine the placement of the Fine Subrange Comparators 140. If the Embedded Coarse Subrange Comparators 130 are all zeroes 150a then the Fine Subrange Comparators will be placed at the lower section of the Voltage Reference Range and if it has a code as in 150b then the placement will be higher on the Voltage Reference Range. Each additional logical 1 to the code as in 150c and 150d will set the placement of the Fine Comparators at higher sections.

Referring to FIG. 6, the input analog signal will be sampled 502 at Clock 1 500. The Coarse Subrange Comparator Outputs will be latched during the second half of Clock 1 period 506. During Clock 1 period 505 the Embedded Coarse Subrange Comparators are decoded and the Fine Subrange Comparators are placed and their outputs are determined in Clock 2 period 510. During Clock 3 period 515, the codes of the Coarse, the Embedded Coarse Subrange, and Fine Comparators are encoded 526 and the valid data is on the Converter output during Clock 3 period 520.

Referring to FIG. 7 the preferred embodiment of the Voltage Reference Generator 100 of FIG. 3. is implemented as set of resistive elements $r_1$ 600, $r_{11}$ 622, $r_{12}$ 626, $r_2$ 630, $r_{21}$ 632, $r_{22}$ 636, $r_n$ 640, $r_{n1}$ 642, $r_{n2}$ 646 are connected to voltages Vrb 600 and Vrt 610 to form a voltage divider that establishes the plurality of voltage references for the Coarse Subrange Comparators 120 of FIG. 3 and the Embedded Subrange Comparators 130 of FIG. 3. Referring to FIG. 7., the Coarse Subrange Comparators 685 output codes form a set of thermometer codes 687 that are the inputs to the Switch Selection Logic 689. The outputs of the Switch Selection Logic 689 $\{S_1, S_2, \ldots, S_n\}$ 690 are uniquely selected to activate a single set of the switches $S_{11}$ 652, $S_{12}$ 656, $S_{13}$ 658, or $S_{21}$ 662, $S_{22}$ 666, $S_{23}$ 668, or $\ldots$, or $S_{n1}$ 672, $S_{n2}$ 676, $S_{n3}$ 678. These switches connect the inputs 682,684,686 of the Embedded Coarse Subrange Comparator 680 to the Voltage References generated by the resistor divider network. For example if $S_2$ 660 selected, then node $X_{21}$ 661 would be connected to input m1 682, node $X_{22}$ 665 would be connected to input m2 684, and node $X_{23}$ 667 would be connected to input m3 686.

Referring to FIGS. 8a and 8b., an example of the preferred embodiment for the Fine Subrange Selection Logic and Switches is shown. The Voltage Reference Generator 1000 is comprised of a plurality of resistive elements r1 1030, r11 1032, r12 1034, r13 1036, r14 1038, r2 1040, r21 1042, r22 1044, r23 1046, r24 1048, r3 1050, r31 1052, r32 1054, r33 1056, r34 1056, r4 1060, r41 1062, r42 1054, r43 1066, r44 1068, r5 1070 connected in a series parallel network to form a voltage divider. The voltages formed at the connection of each resistor $\{V_1$ 1090, $V_2$ 1092, $V_3$ 1054, $V_4$ 1096, $V_5$ 1098$\}$ form the inputs to the Coarse Subrange Comparators 1100. The outputs of the Coarse Subrange Comparators 1100 is a set of thermometer codes 1110 that are the inputs to the Embedded Coarse Subrange Switch Selection Logic 1120. The output of the Embedded Coarse Subrange Switch Selection Logic 1120 activates the appropriate switch of the switches $S_1$ 1231, $S_2$ 1232, $\ldots$, $S_8$ 1238, $S_9$ 1239, to chose the position within a coarse subrange of the Voltage Reference Generator 1000 to place the Embedded Coarse Subrange Comparators 1120. As an example if the analog input voltage Vain in FIG. 3., was larger than $V_4$ 1096 and $V_5$ 1098, but smaller than $V_3$ 1094, $V_2$ 1092, and $V_1$ 1090, the thermometer code could be 00011. This would cause the output $\{S1, S2, \ldots, Sn\}$ 1140 of the Embedded Coarse Subrange Switch Selection Logic 1120 to activate switches $S_5$ 1236, $S_6$ 1236, and $S_7$ 1237 and connect the voltages of the Voltage Reference Generator 1200 as inputs $M_1, M_2, M_3$ 1230 to the Embedded Coarse Subrange Comparators 1200 are the set of thermometer codes that are input to the Combinatorial Logic 1210. The output of the Combinatorial Logic 1210 and the output of the Embedded Coarse Subrange Switch Selection Logic 1120 form the inputs to the Fine Subrange Switch Selection Logic 1130. To continue the example, if the Input Voltage Vain of FIG. 3. is larger than $V_4$ 1096 and smaller than $V_{35}$ 1095 and $V_3$ 1094, then the Fine Subrange Switch Selection Logic 1300 would select line RF1 of the set of output lines $\{RF1, RF2, RF3, RF4\}$ 1310. The RF1 line will activate switches $S_{71}$ 1463, $S_{72}$ 1464, $S_{81}$ 1465, and $S_{82}$ 1466 connecting voltages $V_4$ 1096, $V_{43}$ 1097a, $V_{45}$ 1097b, and $V_{47}$ 1097c, to the Fine Subrange Comparators. As the voltage input Vain of FIG. 3. changes, the Fine Subrange Switch Selection Logic 1300 will select the output of the set of outputs $\{RF1, RF2, RF3, RF4\}$ 1310. The switches will be activated according to the patterns defined by RF1 1320, RF2 1330, RF3 1340, and RF4 1350.

Referring to FIG. 9. the output of the Coarse Subrange Comparators 1500 which forms the First Set of Thermometer Codes is the input to the Coarse Subrange Boundary Logic 1560, The Coarse Subrange Logic 1560 calculates the "1" to "0" boundary in the First Set of Thermometer Codes and then chooses one of a set of lines that will select the entry of the MSB Code Table 1600 that represents the coarse magnitude of the input analog voltage Vain in FIG. 3. The MSB Code 1620 is then one of the inputs to the Digital Output Word Assembly Logic 1640. The output of the Fine Subrange Comparators 1510 form the third thermometer codes which forms the input to the Fine Subrange Boundary Logic 1570. The Fine Subrange Boundary Logic 1570 calculates the "1" to "0" boundary of the Second Set of Thermometer Codes and then chooses one of a set of lines that will select the entry of the LSB Code Table 1610 that represents the fine adjustment of the magnitude of the input analog voltage Vain in FIG. 3. The LSB Code 1630 is then one of the inputs to the Digital Output Word Assembly Logic 1640. The Embedded Coarse Subrange Comparators forms the Second Thermometer Code 1550 which is a third input to the Digital Output Word Assembly Logic 1640. The MSB Code 1620, the LSB Code 1630. and the Second Thermometer Code 1550 are logically manipulated to form the Digital Output Word 1650 which represents the code for the magnitude of the input analog voltage Vain of FIG. 3.

What is claimed is:

1. A subranging analog to digital converter for converting an input analog voltage into an output digital signal comprising:

a) a voltage reference generation means capable of the generation of a plurality of voltage references that are of incremental values across a range of possible input analog voltage values;

b) a first set of voltage comparators that will resolve the input analog voltage into a first set of thermometer codes that will determine a coarse set of subranges of the input voltage;

c) a second set of voltage comparators that will, when connected within a coarse subrange of the coarse set of subranges of the voltage reference generation means, produce a second set of thermometer codes for the placement of a third set of voltage comparators;

d) the third set of voltage comparators that will resolve the coarse subrange into a third set of thermometer codes that will determine a fine set of subranges of the input voltage;

e) a first logical decoding means for selecting from the first set of thermometer codes an appropriate coarse subrange of a coarse set of subranges of the voltage reference generation means and connecting said voltage reference generation means to the second set of voltage comparators;

f) a second logical decoding means for selecting from the first and second set of thermometer codes produced by the first and second set of comparators, an appropriate fine subrange of a set of fine subranges within the appropriate coarse subrange of the set of coarse subranges of the voltage reference generation means and connecting said fine set of voltage references to the third set of voltage comparators;

g) an output encoding means for converting the first, second, and third thermometer codes produced by outputs of the first, second, and third sets of voltage comparators into an output digital word; and h) an input sample and hold circuit means for operably coupling the input analog voltage to the first, second, and third set of voltage comparators and holding a sample of the input analog voltage for a discrete period of time.

2. The subranging analog to digital converter of claim 1 wherein the selection and connection of the second set of comparators is determined and made within the coarse subrange as determined by the first set of comparators.

3. The subranging analog to digital converter of claim 1 wherein the selection and connection of the third set of comparators to the voltage reference generation means is determined by the first and second set of thermometer codes.

4. The subranging analog to digital converter of claim 1 wherein the output of the first, second, and third sets of voltage comparators are resolved into the digital output word that represents the magnitude of the input voltage.

5. The subranging analog to digital converter of claim 1 wherein the plurality of voltage references are generated by the voltage reference generation means comprising:

a) a first reference voltage potential;

b) a second reference voltage potential;

c) a resistive divider means comprising:
   a top terminal operably coupled to the first reference voltage potential;
   a bottom terminal operably coupled to the second reference voltage potential;
   a plurality of serially connected resistors having a first resistor a plurality of intermediate resistors, and a last resistor wherein each resistor has a first connection point and a second connection point, the first connection point of the first resistor is operably connected to the top terminal, and the second connection point of the last resistor is operably connected to the bottom terminal;

d) a plurality of output terminals operably coupled to the first and second connections of each of said plurality of serially connected resistors wherein each of the voltage references is present at each of the plurality of output terminals.

6. The subranging analog to digital converter of claim 1 further comprising a switching means of a first plurality of switching means is operably connected to each of the voltage references of the coarse set of subranges of voltages references.

7. The subranging analog to digital converter of claim 1 further comprising the switching means of a second set of switching means is connected to each of the fine set of subranges of the voltages generation means.

8. The subranging analog to digital converter of claim 6 wherein each switching means is comprising a switch input terminal, a switch output terminal, and a switch selection terminal, wherein the switch input terminal is operably connected or not connected to the switch output terminal dependent on the state of the switch selection terminal.

9. The subranging analog to digital converter of claim 7 wherein each switching means also comprising the switch input terminal, the switch output terminal, and the switch selection terminal, wherein the switch input terminal is operably connected or not connected to the switch output terminal dependent on the state of the switch selection terminal.

10. The subranging analog to digital converter of claim 6 wherein the first set of thermometer codes are logically decoded to determine the state of switch selection terminals of the first plurality of switching means.

11. The subranging analog to digital converter of claim 7 wherein the first and second set of thermometer codes are logically decoded to determine the state of selection terminals of the second plurality of switching means.

12. The subranging analog to digital converter of claim 1 wherein the sample and hold circuit means includes:

a) a sampling means comprising a sampling input terminal a sampled output terminal, a holding terminal, and a timing signal terminal; and b) a voltage retaining means operably connected between the holding terminal and a third reference potential wherein the holding terminal is operably coupled to the input terminal for a first period of time determined by a first state of the timing signal terminal and then operably coupled to the sampled output terminal for a second period of time determined by a second state of the timing signal terminal.

13. The subranging analog to digital converter of claim 1 further comprising a digital encoding means comprising:

a) a first set of thermometer code inputs;

b) a second set of thermometer code inputs;

c) a third set thermometer code inputs;

d) a first data encoding means operably coupled to the first set of thermometer code inputs wherein the first set of thermometer codes is transformed to a first digital code;

e) a second data encoding means operably coupled to the second set of thermometer code inputs wherein the second set of thermometer codes is transformed to a second digital code; and f) a third data encoding means operably coupled to the third set of thermometer code inputs wherein the first and second digital codes are modified according to the third thermometer code to form the digital output word that is placed on a set of digital output word terminals.

14. The subranging analog to digital converter of claim 1 wherein the first, second, and third sets of voltage comparators have a plurality of first voltage comparator means, comprising a first voltage reference terminal, a first voltage comparison terminal, and a first digital output terminal, wherein one of the plurality of voltage references is operably connected to the first voltage reference terminal, the input voltage is operably coupled to the first voltage compare terminal, and the first digital output terminal has a digital output signal that indicates whether the magnitude of the first voltage compare terminal is larger or smaller than the magnitude of the voltage at the first voltage reference terminal.

15. The subranging analog to digital converter of claim 1 wherein the digital output signals of the first set of voltage comparators form the first set of thermometer codes representing the magnitude of the input voltage with respect to the voltage references of the coarse set of voltage reference generation means.

16. The subranging analog to digital converter of claim 1 wherein the digital output signals of the second set of voltage comparators form the second set of thermometer codes representing the magnitude of the input voltage with respect to the voltage references within a coarse subrange of the voltage reference generation means.

17. The subranging analog to digital converter of claim 1 wherein the digital output signals of the third set of voltage comparators form the third set of thermometer codes representing the magnitude of the input voltage with respect to the voltage reference within the fine subrange of the voltage reference generation means.

18. The subranging analog to digital converter of claim 1 wherein
    a) the first logical decoding means, is comprising:
        a first set of comparator input terminals;
        a first set of combinatorial logic, and
        a first set of combinatorial logic output terminals, wherein the first set of comparator input terminals are operably coupled to the outputs of the first set of voltage comparators, which are the first set of thermometer codes;
    b) the first set of thermometer codes are logically manipulated; and
    c) the results being placed at the first set of combinatorial logic output terminals which are operably coupled to the selection terminals of the first plurality of switching means to determine the placement of the second set of voltage comparators at the appropriate coarse subrange of the set of coarse subranges of the reference voltage generation means.

19. The subranging analog to digital converter of claim 1 wherein
    a) the second logical decoding means is comprising:
        a second set of comparator input terminals,
        a second set of combinatorial logic, and
        a second set of combinatorial logic output terminals, wherein the second set of comparator input terminals are operably coupled to the outputs of the second set of voltage comparators, which are the second set of thermometer codes;
    b) the second set of thermometer codes are logically manipulated; and
    c) the results being placed at the second set of combinatorial logic output terminals which are operably coupled to the selection terminals of the second plurality of switching means to determine the placement of the third set of voltage comparators at the appropriate fine subrange of the set of fine subranges of the reference voltage generation means.

20. A subranging analog to digital converter for converting an analog voltage to a digital signal comprising:
    a) the input sample and hold circuit means for the sampling of the input analog voltage and operably coupling and holding said coupling for a discrete conversion time to:
        a coarse subrange set of voltage comparing means,
        an embedded coarse subrange of voltage comparing means, and
        a fine subrange set of voltage comparing means;
    b) a voltage dividing means for the generation of the plurality of voltage references;
    c) a set of embedded coarse subrange switching means to operably couple or not couple a coarse subrange of the coarse set of subranges of the voltage reference generation means to the embedded coarse subrange of comparing means, dependent on an embedded coarse subrange switch selection signal;
    d) a set of fine subrange switching means to operably couple or not couple a fine set of the set of fine sets of voltage reference generation means to the fine set of voltage comparing means, dependent on a fine subrange switch selection signal;
    e) the coarse subrange voltage comparing means that will resolve a sample of the input analog voltage into the first set of thermometer codes;
    f) the embedded coarse subrange set of voltage comparing means that will resolve the sample of the input analog voltage into the second set of thermometer codes;
    g) the fine subrange set of voltage comparing means that will resolve the sample of the input analog voltage into the third set thermometer codes;
    h) an embedded coarse subrange switch selection determination means that will resolve the first thermometer codes into the embedded coarse switch selection signal to determine which switching means of the set of embedded coarse switching means is activated to operably couple the embedded coarse subrange voltage comparing means within the appropriate coarse subrange of the coarse set of voltage references;
    i) a fine subrange switch selection determination means that will resolve the first and second set of thermometer codes into the fine subrange switch selection signal to determine which switching means of the set of fine subrange switching means is activated to operably couple the fine subrange set of voltage comparing means to the appropriate fine subranges of the voltage references; and
    j) a digital output encoding means for converting the first, second, and third thermometer codes into the output digital word.

21. The subranging analog to digital converter of claim 20 wherein the sample and hold means includes:
    a) a sampling means comprising a sampling input terminal
    b) a sampled output terminal, a holding terminal,
    c) a timing signal terminal; and
    d) a voltage retaining means operably connected between the holding terminal and a third reference potential wherein the holding terminal is operably coupled to the input terminal for a first period of time determined by a first state of the timing signal terminal and then operably coupled to the sampled output terminal for a second period of time determined by a second state of the timing signal terminal.

22. The subranging analog to digital converter of claim 20 wherein the voltage divider means is comprising:
    a) an upper reference potential;
    b) a lower reference potential;
    c) a resistive divider means comprising:
        a top terminal operably coupled to the upper reference voltage potential;
        a bottom terminal operably coupled to the lower reference voltage potential;

the plurality of serially connected resistors wherein the first connection point of the first resistor is operably connected to the top terminal, and the second connection point of the last resistor is operably connected to the bottom terminal;

the plurality of output terminals operably coupled to the first and second connections of each of said plurality of serially connected resistors of the resistive divider means wherein each of the voltage references is present at each of the plurality of output terminals.

23. The subranging analog to digital converter of claim 20 wherein the set of embedded coarse subrange switching means and the set of the fine subrange switching means have a switch input terminal, a switch output terminal, and a switch selection terminal, wherein the switch input terminal is operably connected or not connected to the switch output terminal dependent on the state of the switch selection terminal.

24. The subranging analog to digital converter of claim 20 wherein the coarse subrange set of voltage comparing means embedded coarse subrange set of voltage comparing means, and the fine subrange set of voltage comparing means have a plurality of voltage comparing means comprising a second voltage reference terminal, a second voltage comparison terminal, and a second digital output terminal, wherein one of the plurality of voltage references is operably connected to the second voltage reference terminal, the input voltage is operably coupled to the second voltage compare terminal, and the second digital output terminal have a second digital output signal that indicates whether the magnitude of the second voltage compare terminal is larger or smaller than the magnitude of the voltage at the second voltage reference terminal.

25. The subranging analog to digital converter of claim 20 wherein the embedded coarse switch selection determination means comprising:

a) a first thermometer code input terminal operably coupled to the coarse subrange voltage comparing means;

b) an embedded coarse subrange switch selection logic, operably connected to the first thermometer code input terminal, wherein the first set of thermometer codes are logically manipulated to determine the appropriate set if the embedded coarse subrange switching means to operably connect the appropriate coarse subrange of the set of coarse subranges of the voltage references to the embedded coarse subrange voltage comparing means; and c) An embedded coarse switch selection output terminal operably coupled to the embedded coarse subrange switch selection logic and to each of the switch selection terminals of the set of embedded coarse subrange switching means.

26. The subranging analog to digital converter of claim 20 wherein the embedded coarse switch selection determination means comprising:

a) a first thermometer code input terminal operably coupled to the coarse subrange voltage comparing means;

b) a second thermometer code input terminal operably coupled to the embedded coarse subrange voltage comparing means;

c) an fine subrange switch selection logic, operably connected to the first thermometer code input terminal and the second thermometer code input terminal, wherein the first set of thermometer codes and second set of thermometer codes are logically manipulated to determine the appropriate set if the fine subrange switching means to operably couple the appropriate fine subrange of the set of fine subranges of the voltage references to the fine subrange voltage comparing means; and d) a fine subrange switch selection output terminal operably coupled to the embedded coarse subrange switch selection logic and to each of the switch selection terminals of the set of fine subrange switching means.

27. The subranging analog to digital converter of claim 20 wherein the digital output encoding means comprising:

a) a first set of thermometer code input terminals;

b) a second set of thermometer code input terminals;

c) a third set thermometer code input terminals;

d) a first digital data encoding means operably coupled to the first set of thermometer code input terminals wherein the first set of thermometer codes is transformed to the first digital code;

e) a second data encoding means operably coupled to the second set of thermometer code input terminals wherein the second set of thermometer codes is transformed to the second digital code; and f) a third data encoding means operably coupled to the third set of thermometer code input terminals wherein the first and second digital codes are modified according to the third thermometer code to form the digital output word that is placed on the set of digital output word terminals.

28. A method for processing of an algorithm for the subranging analog to digital converter comprising the steps of:

a) sampling the input analog voltage;

b) holding the sample of the input analog voltage for the discrete conversion time;

c) comparing of the sample of the input analog voltage to the coarse set of voltage references to form the first set of thermometer codes;

d) logically manipulating the first set of thermometer codes;

e) determining the placing of the embedded coarse subrange voltage comparing means within the appropriate subrange of the set of coarse subranges of the voltage references;

f) comparing of the input analog voltage with an embedded coarse set within the appropriate coarse set of voltage references to form a second set of thermometer codes;

g) logically manipulating the first and second sets of thermometer codes;

h) determining the selecting of an appropriate fine subrange of the set of fine subranges of the voltage references;

i) comparing of the sample of the input analog voltage with the appropriate fine subrange of the set of fine subranges of the voltage references to for the third set of thermometer codes; and j) logically manipulating the first, second, and third sets of thermometer codes to form the digital output word.

29. A method for processing of an algorithm for the subranging analog to digital converter of claim 28 wherein logically manipulating the first set of thermometer codes calculates a first unique boundary signifying the change from a "1" to a "0" of the first set of thermometer codes.

30. A method for processing of an algorithm for the subranging analog to digital converter of claim 28 wherein logically manipulating the second set of thermometer codes calculates a second unique boundary signifying the change from a "1" to a "0" of the second set of thermometer codes.

31. A method for processing of an algorithm for the subranging analog to digital converter of claim 28 wherein logically manipulating the third set of thermometer codes calculates a third unique boundary signifying the change from a "1" to a "0" of the third set of thermometer codes.

32. A method for processing of an algorithm for the subranging analog to digital converter of claim 29 wherein the first unique boundary determines the selecting of the embedded coarse subrange switching means within the appropriate coarse subrange of the set of coarse subranges of the set of voltage references.

33. A method for processing of an algorithm for the subranging analog to digital converter of claim 30 wherein the first unique boundary determines the selecting of the fine subrange switching means within the appropriate fine subrange of the set of fine subranges of the set of voltage references.

34. A method for processing of an algorithm for the subranging analog to digital converter of claim 28 wherein:

a) logically manipulating the first, second, and third sets of thermometer codes calculates a set of unique boundaries signifying the change from a "1" to a "0" of the first, second, and third set of thermometer codes;

b) uses the unique boundary for the first set of thermometer codes to select from a table of most significant bits, the appropriate set of most significant bits representing the magnitude of the coarse subrange of the input voltage;

c) uses the unique boundary for the second set of thermometer codes to select from a table of least significant bits, the appropriate set of least significant bits representing the magnitude of the fine subrange of the input voltage;

d) uses the unique boundary for the third set of thermometer codes to modify the appropriate most significant bits and the appropriate least significant bits to form the digital output word.

* * * * *